(12) United States Patent
Waheed et al.

(10) Patent No.: US 7,439,817 B2
(45) Date of Patent: Oct. 21, 2008

(54) FREQUENCY TUNING RANGE EXTENSION AND MODULATION RESOLUTION ENHANCEMENT OF A DIGITALLY CONTROLLED OSCILLATOR

(75) Inventors: Khurram Waheed, Plano, TX (US); Siraj Akhtar, Richardson, TX (US); Robert B. Staszewski, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 48 days.

(21) Appl. No.: 11/618,034

(22) Filed: Dec. 29, 2006

(65) Prior Publication Data

US 2007/0188243 A1    Aug. 16, 2007

Related U.S. Application Data

(60) Provisional application No. 60/774,107, filed on Feb. 16, 2006.

(51) Int. Cl.
*H03L 7/00* (2006.01)
(52) U.S. Cl. .................. 331/16; 375/376; 331/1 A; 331/177 V
(58) Field of Classification Search ............... None
See application file for complete search history.

(56) References Cited

U.S. PATENT DOCUMENTS

| | | | | |
|---|---|---|---|---|
| 7,046,098 | B2 * | 5/2006 | Staszewski | ................ 331/158 |
| 2003/0133522 | A1 | 7/2003 | Staszewski et al. | ......... 375/345 |
| 2004/0146132 | A1 | 7/2004 | Staszewski et al. | ......... 375/376 |
| 2006/0033582 | A1 | 2/2006 | Staszewski et al. | ........... 331/16 |
| 2006/0145771 | A1 * | 7/2006 | Strange | ....................... 331/16 |
| 2006/0226916 | A1 * | 10/2006 | Florescu et al. | ............... 331/16 |
| 2007/0188244 | A1 * | 8/2007 | Waheed et al. | ................ 331/16 |

OTHER PUBLICATIONS

T.Pittorino et al., "A UMTS-Compliant Fully Digitally Controlled Oscillator with 100MHz Fine-Tuning Range in 0.13um CMOS," ISSCC 2006, pp. 210-211, 649.

Staszewski et al., "A First Multigigahertz Digitally Controlled Oscillator for Wireless Applications," IEEE Trans. Microwave Theory and Techniques, vol. 51, No. 11, Nov. 2003, pp. 2154-2164.

* cited by examiner

*Primary Examiner*—Joseph Chang
(74) *Attorney, Agent, or Firm*—Ronald O. Neerings; Wade James Brady, III; Frederick J. Telecky, Jr.

(57) ABSTRACT

A novel apparatus and method of extending the frequency tuning range and improving the modulation resolution of an RF digitally controlled oscillator (DCO). In addition to the coarse PVT MIM varactor bank, the DCO uses a single unified bank of varactors that is further subdivided divided into an MSB bank, LSB bank and sigma-delta (SD-LSB) bank. Any ratio mismatches between MSBs and LSBs are digitally calibrated out using a DCO step-size pre-distortion scheme wherein the LSB steps are adjusted to account for the ratio mismatch between the MSB/LSB step sizes. A harmonic characterization technique is used to estimate the mismatches in the minimal size CMOS tuning varactors of a digitally controlled RF oscillator (DCO), wherein the nominal ratio mismatch between the MSB and LSB devices is estimated using hybrid stochastic gradient DCO gain estimation algorithms. The nominal ratio mismatch and the mismatches in the MSB and LSB banks are used to determine the average MSB/LSB mismatch. The average mismatch value is then used to correct the LSB steps.

26 Claims, 11 Drawing Sheets

FREQUENCY TUNING RANGE EXTENSION AND MODULATION RESOLUTION ENHANCEMENT OF A DIGITALLY CONTROLLED OSCILLATOR

REFERENCE TO PRIORITY APPLICATION

This application claims priority to U.S. Provisional Application Ser. No. 60/774,107, filed Feb. 16, 2006, entitled "Frequency Tuning Range Extension and Modulation Resolution Improvement of a Digitally Controlled Oscillator", incorporated herein by reference in its entirety.

FIELD OF THE INVENTION

The present invention relates to the field of data communications and more particularly relates to an apparatus for and method of frequency tuning range extension and modulation resolution enhancement of a radio frequency (RF) digitally controlled oscillator (DCO) in an all digital phase locked loop (ADPLL).

BACKGROUND OF THE INVENTION

Modern radio frequency (RF) CMOS designers are facing new integration and characterization paradigms due to the coexistence of traditional analog RF wireless designs with digital base-band signal processors and power management on the same physical die. While deep-submicron CMOS processes present new integration opportunities on one hand, they make it extremely difficult to implement high fidelity traditional analog circuits, on the other. The latest CMOS technology parameters are optimized for low cost digital designs only. This forces the analog and mixed-signal designers, using these technologies, to make multi-dimensional trade-offs. The conflicting requirements of area, power and performance in the modern wireless cellular handsets force the designer to intelligently budget parameters such as noise, linearity, gain, supply voltage, signal headroom, impedance, power leakage and dissipation. The inability of SPICE models and other simulators to model the complete RF operational environment mandates several expensive design and fabrication iterations before arriving at a production worthy solution. Although device modeling has recently benefited greatly from the advances in the computational modeling techniques, rapid scaling of technology as well as architectural requirements and device-level innovations appear to hamper the modeling accuracy faster.

Historically, analog circuits have lagged in production ramping behind digital circuitry by more than one CMOS generation, failing to utilize the full potential of new processes or to comply with the new supply-voltage scaling. The quandary of poor characterization leads to substantial conservatism in initial analog designs. This leads to expensive cost of design iterations, thus resulting in circuits that do not exploit the raw speed of the latest technology. For example, precise frequency tuning of a low-voltage deep-submicron CMOS digitally-controlled oscillator is an extremely challenging task due to its highly nonlinear frequency versus voltage characteristics. Low-voltage headroom also makes it susceptible to the substrate and the power/ground supply noise. Furthermore, it is extremely difficult to guarantee correct output DCO frequency and tuning step without accurate data on the constituent tuning devices, parasitics and device variation across process, voltage and temperature.

Sometimes, the task is further complicated by the difficulty in even making reliable laboratory measurements due to the accuracy issues caused by probing noise, minuscule device sizing, dynamic effects and loading. Some key device characteristics of the DCO, for example, capacitor mismatch, thermal and flicker (1/f) noise contributions are quite difficult to measure accurately. For small capacitors used in most analog circuits, generally in the range of 0.1-1 picofarads, direct measurement would possess many uncertainties resulting from parasitics in the physical test setup. Varactors built in CMOS technology are even smaller, typically in the attofarad to femtofarad range. These varactors also suffer from a relatively low quality factor and exhibit substantial series resistance due to the n-well material. All these attributes render the characterization of varactors extremely difficult.

Further, good quality control of CMOS fabrication is a prerequisite to the mass production of wireless standard specification-compliant transmitters. The amount of mismatch, in the smallest sized DCO bank varactors used for frequency command tracking, is critical to the performance of ADPLL based transceivers due to its direct impact on the spectral purity of the DCO and hence the transceiver built using it.

While digital polar modulated transmitters have been demonstrated for GGE (GSM,GPRS and EDGE), their usage for 3G remains a daunting task. Polar modulation relies on splitting the digital I/Q baseband input signal into a phase (or its time derivative, frequency) and an amplitude data streams. The differentiated phase signal ($f=\Delta\theta/\Delta t$) is used to directly modulate a digitally controlled oscillator (DCO), the output of which is combined with the amplitude signal ($\rho$) in a digital pre-power amplifier (PPA) or digitally-controlled power amplifier (DPA). The $f=\Delta\theta/\Delta t$ component generated when passing, e.g., the 3.84 MHz WCDMA I/Q signal through a CORDIC transformation algorithm spreads significantly due to the non linear (arctan) operation. It is no longer band-limited and theoretically infinite modulation of the oscillator is needed to represent this phase signal. Although in a discrete time system, the maximum frequency deviation will be limited to the sampling rate, it is still in the order of tens of megahertz as shown in FIG. 1 for the CORDIC operating at 60 MHz. Given that the DCO can operate at four times the channel frequency, the required modulation is four times that shown in FIG. 1. Any truncation in phase data will degrade Error Vector Magnitude (EVM) and produces spectral regrowth.

Tight modulation resolution has to be maintained in order to keep the frequency quantization noise much lower than electronic or thermal DCO phase noise. In order to satisfy the close-in spectral mask as well as the requisite phase error (or EVM) performance for the GSM/EDGE/WCDMA polar transmitters, any degradation due to the INL and DNL in the DCO has to be avoided.

It is further desirable to have characterization methodologies, which do not penalize the device area budget, do not consume extensive testing time and can be easily ported into the next generations of the CMOS processes with minimal adjustments. Specifically, there is a need for a varactor characterization technique to estimate the mismatches in the tracking bank (i.e., unified bank) tuning varactors of an RF DCO. The DCO being a vital component of the digital radio frequency processor (DRP) technology at the heart of modern GSM/EDGE/UMTS RF transceiver designs.

Once the characterization and calibration of such device mismatches is understood, development of digital circuits that allow for the compensation of such inter-device ratio, random and possibly systematic mismatches is a must.

SUMMARY OF THE INVENTION

The present invention is a novel apparatus and method of extending the frequency tuning range and improving the modulation resolution of an RF digitally controlled oscillator (DCO). The invention provides a new mechanism of arranging the DCO varactor banks so as to achieve wider modulation tuning range from the DCO in a two-point modulation scheme as done in the polar domain using the DRP based transmitter architecture.

Further, the invention provides a simple, fast and efficient harmonic mismatch characterization technique for the mismatch characterization of the minimal sized varactors in a multi-gigahertz DCO. This technique can be used in conjunction with the techniques discussed in U.S. patent application Ser. No. 11/460,221 to Waheed et al., entitled "Hybrid Stochastic Gradient Based Digital Controlled Oscillator Gain KDCO Estimation," U.S. Patent Publication No. 2003/0133522 to Staszewski et al., entitled "All-Digital Frequency Synthesis With DCO Gain Calibration," or U.S. Patent Publication No. 2006/0033582 to Staszewski et al., entitled "Gain Calibration of a Digital Controlled Oscillator," U.S. patent application Ser. No. 11/551,103 to Staszewski et al., entitled "Apparatus And Method For Acquisition And Tracking Bank Cooperation In A Digitally Controlled Oscillator", all of which are incorporated herein by reference in their entirety. The proposed technique is amenable to laboratory automation and built-in self-test (BIST) and is suitable for fast characterization of fabrication quality in mass-scale produced RF integrated radios. Further, an example digital circuit is presented to compensate for the possible ratio mismatch in the banks of the transmitter.

For the wide bandwidth DCO comprising a PVT bank (for initial locking) and a single unified bank of varactors (to be used both before and after locking), the unified bank is further divided into an MSB bank, LSB bank and a fractional sigma-delta (SD-LSB) bank. Any mismatches between MSBs and LSBs are digitally calibrated out using a pre-distortion scheme wherein the LSB steps are adjusted to account for the mismatch between the MSB/LSB step sizes. A harmonic calibration technique is used to determine the average MSB/LSB mismatch. In the simplest scheme, the average mismatch value is used to correct the LSB steps. Note that the ratio between the MSB and LSB devices in the instant embodiment is a function of the fabricated device geometry only and does not depend on temperature, frequency, process and voltage. In this case, the calibration scheme is simplified.

The invention is applicable to any system in which it is desirable to extend the frequency tuning range and improve the modulation accuracy/resolution of a digitally controlled RF oscillator such as employed in mobile phones and other wireless applications. The invention is intended for use in a digital radio transmitter or transceiver but can be used in other applications as well, such as a general communication channel and data converters.

One advantage of the range extension and modulation resolution improvement scheme of the present invention for the enhanced tuning range DCO is that the unified varactor bank permits the use of a fewer number of control lines (e.g., 128+16=144). This results in a more compact circuit layout, minimizing parasitic capacitance. Extremely tight matching can be achieved by design between the MSB and LSB devices ensuring monotonic frequency transition and acceptable INL and DNL. Any mismatch between the LSBs and a particular MSB can be further digitally calibrated using the predistortion scheme of the invention.

Another advantage is that the relatively quick harmonic calibration scheme of the invention can be used to determine the average MSB or LSB device mismatches using a harmonic characterization technique whereas the average MSB/LSB mismatches can be quickly estimated without extensive laboratory measurements. For the nominal ratio estimation between MSB and LSB devices of the unified bank the KDCO gain estimation techniques described in the cited patent applications can be used.

Note that many aspects of the invention described herein may be constructed as software objects that are executed in embedded devices as firmware, software objects that are executed as part of a software application on either an embedded or non-embedded computer system running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the invention, an apparatus for extending the frequency tuning range of a digitally controlled oscillator (DCO) comprising a single segmented unified tuning bank comprising a coarse tuning bank comprising a plurality of coarse tuning devices adapted to provide coarse frequency tuning control of the DCO, a fine tuning bank comprising a plurality of fine tuning devices adapted to provide fine frequency tuning control of the DCO and a pre-distortion circuit operative to compensate a DCO input signal for mismatches between the coarse tuning devices and the fine tuning devices to yield a compensated DCO input signal thereby.

There is also provided in accordance with the invention, an apparatus for extending the frequency tuning range and enhancing the modulation resolution of a digitally controlled oscillator (DCO) comprising a single segmented unified tuning bank comprising a coarse tuning bank comprising a plurality of coarse tuning devices adapted to provide coarse frequency tuning control of the DCO, a fine tuning bank comprising a plurality of fine tuning devices adapted to provide fine frequency tuning control of the DCO, harmonic calibration means in combination with a DCO gain estimation means operative to determine a mismatch error value between the coarse tuning devices and the fine tuning devices and a pre-distortion circuit operative to compensate a DCO input signal for mismatches between the coarse tuning devices and the fine tuning devices utilizing the mismatch error value to yield a compensated DCO input signal thereby.

There is further provided in accordance with the invention, a transmitter comprising a frequency synthesizer for performing a frequency modulation; the frequency synthesizer comprising a digitally controlled oscillator (DCO), the DCO comprising means for extending the frequency tuning range of the DCO comprising a single segmented unified tuning bank comprising a coarse tuning bank comprising a plurality of coarse tuning devices adapted to provide coarse frequency tuning control of the DCO, a fine tuning bank comprising a plurality of fine tuning devices adapted to provide fine frequency tuning control of the DCO, harmonic calibration means in combination with DCO gain estimation means for determining an average ratio mismatch error value between the coarse tuning devices and the fine tuning devices and a pre-distortion circuit operative to compensate a DCO input signal for mismatches between the coarse tuning devices and the fine tuning devices utilizing the mismatch error value to yield a compensated DCO input signal thereby.

There is also provided in accordance with the invention, a digital to analog quantity converter (DAC) comprising a single segmented unified bank of conversion devices comprising a coarse bank comprising a plurality of coarse conversion devices adapted to provide coarse control of the analog quantity, a fine bank comprising a plurality of fine conversion devices adapted to provide fine control of the analog quantity and a step-size pre-distortion circuit operative to compensate a DAC input signal for mismatches between the coarse conversion devices and the fine conversion devices to yield a compensated DAC input signal thereby.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
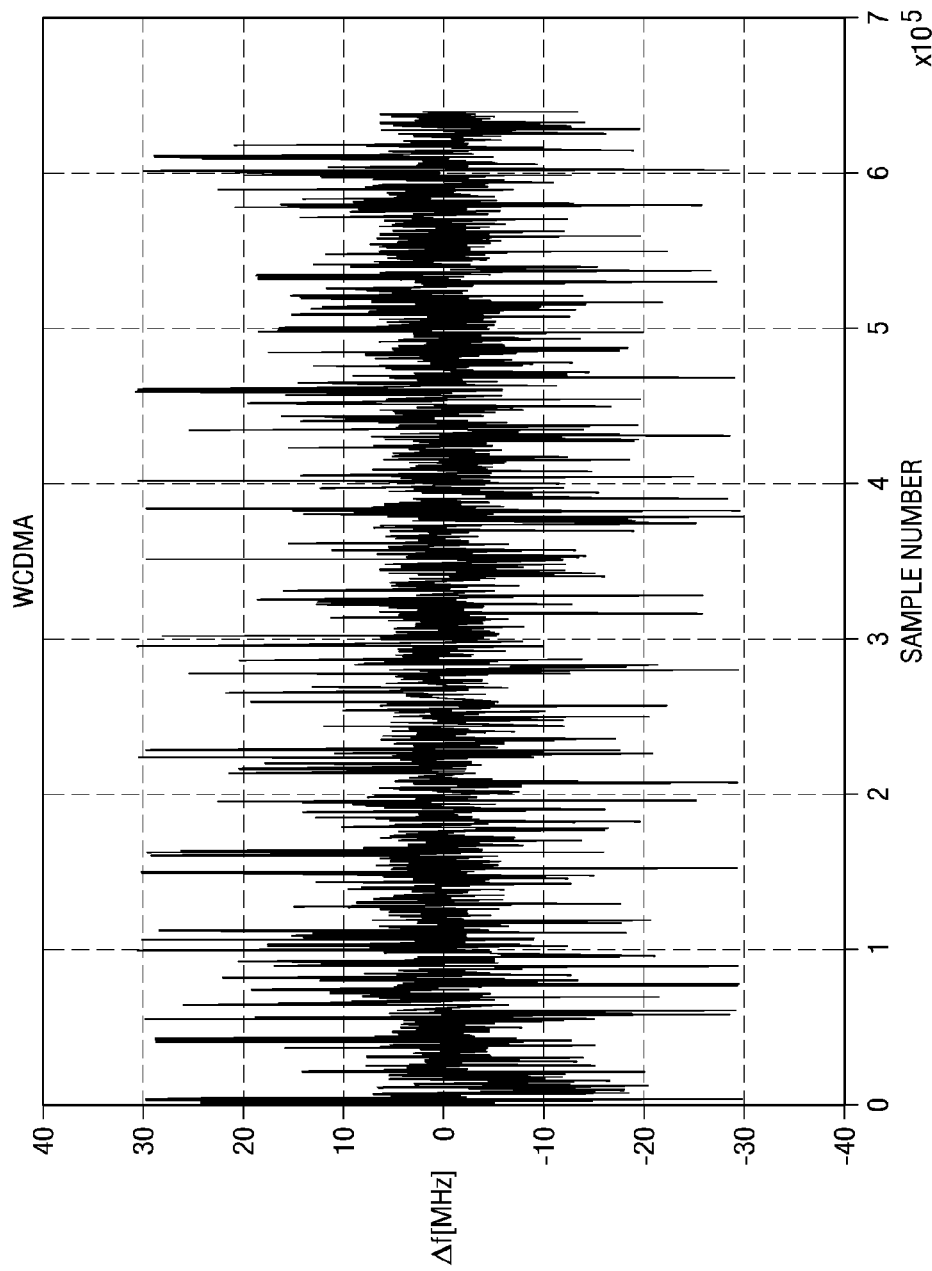
FIG. 1. is a graph illustrating the frequency deviation component of typical WCDMA modulation with the cordic running at 60 MHz.

The following notation is used throughout this document.

| Term | Definition |
| --- | --- |
| AB | Acquisition Bank |
| ACLR | Adjacent Channel Leakage Ratio |
| ADPLL | All Digital Phase Locked Loop |
| ASIC | Application Specific Integrated Circuit |
| CKR | Retimed Reference Clock |
| CKV | Variable Oscillator Clock |
| CMOS | Complementary Metal Oxide Semiconductor |
| DCO | Digitally Controlled Oscillator |
| DCS | Digital Cellular System |
| DNL | Differential Non-Linearity |
| DRP | Digital RF Processor or Digital Radio Processor |
| EDGE | Enhanced Data rates for GSM Evolution |
| EVM | Error Vector Magnitude |
| FCW | Frequency Command Word |
| FPGA | Field Programmable Gate Array |
| FREF | Frequency Reference |
| GGE | GSM, GPRS and EDGE |
| GPRS | General Packet Radio Service |
| GSM | Global System for Mobile Communications |
| HB | High Band |
| HDL | Hardware Description Language |
| IC | Integrated Circuit |
| IEEE | Institute of Electrical and Electronic Engineers |
| IIR | Infinite Impulse Response |
| INL | Integral Non-Linearity |
| LB | Low Band |
| LSB | Least Significant Bit |
| MIM | Metal Insulator Metal |
| MOSCAP | Metal Oxide Semiconductor Capacitor |
| MSB | Most Significant Bit |
| OTW | Oscillator Tuning Word |
| PB | PVT Bank |
| PCS | Personal Communications Service |
| PDF | Probability Density Function |
| PLL | Phase Locked Loop |
| PN | Phase Noise |
| PVT | Process, Voltage, Temperature |
| RF | Radio Frequency |
| RMS | Root Mean Squared |
| SD | Sigma-Delta |
| TB | Tracking Bank |
| TDC | Time to Digital Converter |
| UB | Unified Bank |
| UMTS | Universal Mobile Telecommunications System |
| VHDL | VHSIC Hardware Description Language |
| WCDMA | Wideband Code Division Multiple Access |
| WLAN | Wireless Local Area Network |

DETAILED DESCRIPTION OF THE INVENTION

The present invention is a novel apparatus and method of extending the frequency tuning range and/or improving the modulation resolution of an RF digitally controlled oscillator (DCO). A single unified bank of varactors is divided into an MSB bank, LSB bank and fractional sigma-delta (SD-LSB) bank. Any mismatches between MSBs and LSBs are digitally calibrated out using a pre-distortion scheme wherein the LSB and SD-LSB steps are adjusted to account for the possible ratio mismatch between the MSB/LSB step sizes. The average ratio mismatch is estimated by an estimation of the DCO gain (or KDCO) for the MSB and LSB steps. Further, a harmonic calibration technique is used to determine the random MSB and LSB mismatches.

In the simplest scheme, the average ratio mismatch value is estimated using the estimates of the nominal ratio mismatch and the random mismatches in the MSB, LSB, respectively.

The mismatch value is used to correct the LSB steps, using the relation $$\left[\frac{MSB}{LSB}\right]_{AVE} = \left[\frac{MSB}{LSB}\right]_{NOM} + f(\sigma_{MSB}^{MISM}, \sigma_{LSB}^{MISM}, \gamma(P, D)) \quad (1)$$

where $\left[\frac{MSB}{LSB}\right]_{AVE}$ is the computed average ratio mismatch using the nominal ratio estimate $$\left[\frac{MSB}{LSB}\right]_{NOM}$$

and a correction factor $f(.)$, which is a function of the device mismatches in the MSB devices ($\sigma_{MSB}^{MISM}$), device mismatches in the LSB devices ($\sigma_{LSB}^{MISM}$) and an adjustment term $\gamma(.)$ computed to accommodate the particular process technology and type of varactors being used.

Note that, for the same type of devices, the ratio between the MSB and LSB devices is a function of the fabricated device geometry only and does not depend on temperature, frequency, process and voltage.

The invention is applicable to any system in which it is desirable to extend the frequency tuning range and improve the modulation resolution of a digitally controlled RF oscillator such as employed in mobile phones and other wireless applications. The invention is intended for use in a digital radio transmitter or transceiver but can be used in other applications as well, such as a general communication channel and digital to analog data converters. Note that "analog" can be any quantity after transformation such as amplitude control of a pre-power amplifier (PA driver), or frequency control of the DCO, etc. In case of a digitally-controlled power amplifier, the equivalent of the controllable varactors are the MOS transistors that act as finite-resistance switches.

To aid in understanding the principles of the present invention, the description is provided in the context of a digital RF processor (DRP) based transmitter and receiver that may be adapted to comply with a particular wireless communications standard such as GSM, Bluetooth, EDGE, WCDMA, WLAN, WiMax, etc. It is appreciated, however, that the invention is not limited to use with any particular communication standard and may be used in optical, wired and wireless applications. Further, the invention is not limited to use with a specific modulation scheme but is applicable to any modulation scheme including both digital and analog modulations. The invention is applicable to any system in which it is desirable to estimate, calibrate and track the modulation gain of a digitally controlled oscillator and the need to avoid any spectral degradation due to varactor ratio and sizing mismatches.

Note that throughout this document, the term communications device is defined as any apparatus or mechanism adapted to transmit, receive or both transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof. The notation DRP is intended to denote either a Digital RF Processor or Digital Radio Processor. References to a Digital RF Processor infer a reference to a Digital Radio Processor and vice versa.

Figure 2:
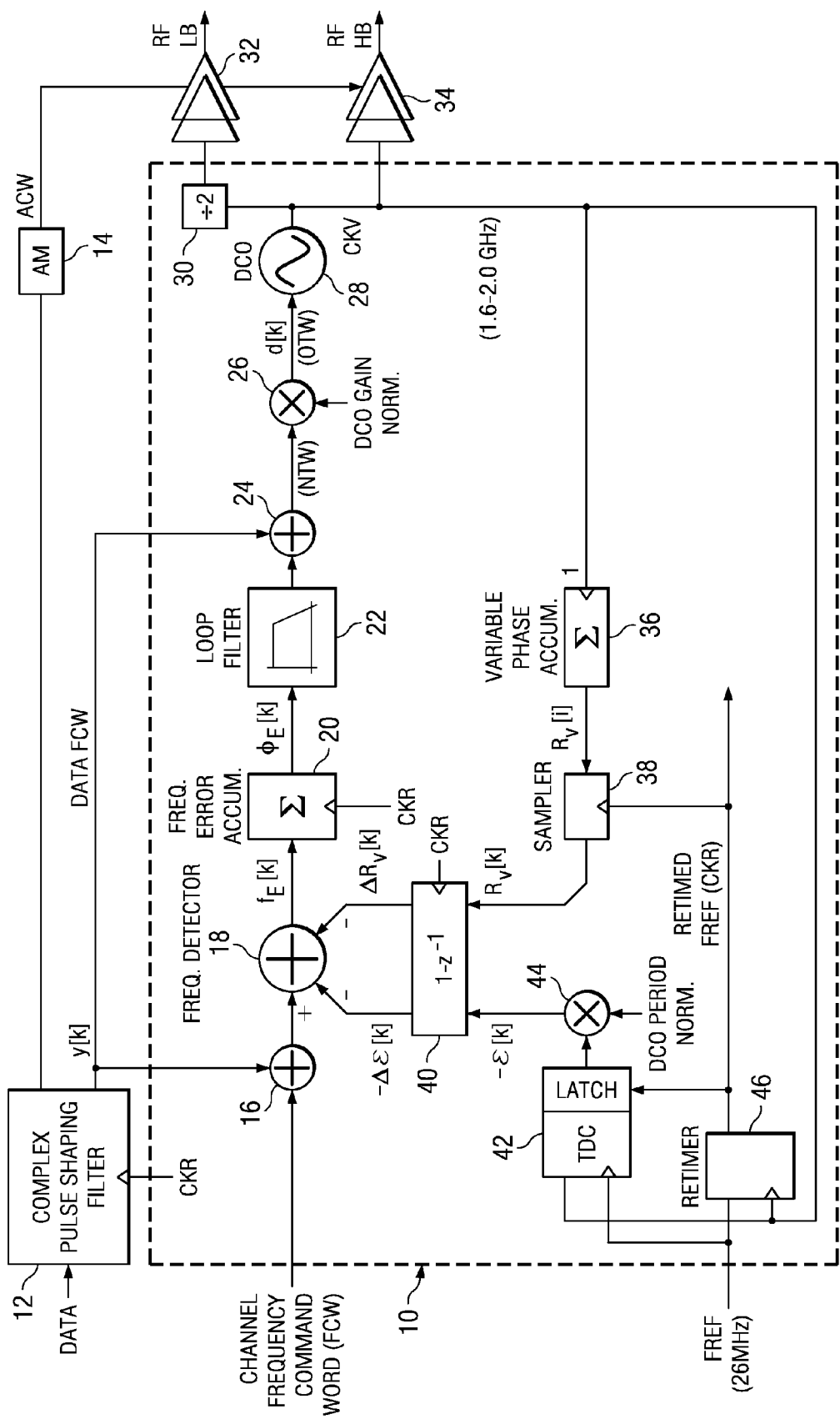
FIG. 2 is a block diagram illustrating an all digital phase locked loop (ADPLL) based polar transmitter constructed in accordance with the present invention.

A block diagram illustrating an example of an all digital phase locked loop (ADPLL) based polar transmitter constructed in accordance with the present invention is shown in FIG. 2. For illustration purposes only, the transmitter, as shown, is adapted for the GSM/EDGE/WCDMA cellular standards. It is appreciated, however, that one skilled in the communication arts can adapt the transmitter illustrated herein to other modulations and communication standards as well without departing from the spirit and scope of the present invention. For example, the transmitter illustrated in FIG. 2 can be extended for performing any arbitrary quadrature modulation scheme. Furthermore, the transceiver may be based on an evolution of ADPLL architecture, like the interpolative ADPLL or similar, in which the phase or frequency detection operation, subsequent phase error filtering and DCO modulation is done on a clock that is an integer-division of the DCO clock.

A description of the ADPLL, generally referenced 10, including the frequency/phase modulation path is provided hereinbelow. The core of the ADPLL is a digitally controlled oscillator (DCO) 28 adapted to generate the RF oscillator clock CKV. The oscillator core (not shown) operates at least twice the 1.6-2.0 GHz high band frequency or at least four times the 0.8-1.0 GHz low band frequency. The output of the DCO is then divided for precise generation of RX quadrature signals, and for use as the transmitter's carrier frequency. The single DCO is shared between transmitter and receiver and is used for both the high frequency bands (HB) and the low frequency bands (LB). In additional to the integer control of the DCO, at least 3-bits of the minimal varactor size used are dedicated for $\Sigma\Delta$ dithering in order to improve frequency resolution, as described in more detail infra. The DCO comprises of a number of varactor banks, which may be realized as n-poly/n-well inversion type MOS capacitor (MOSCAP) devices or Metal Insulator Metal (MIM) devices that operate in the flat regions of their C-V curves to assist digital control. The output of the DCO is input to the RF high band pre-power amplifier (PPA) 34. It is also input to the RF low band pre-power amplifier 32 after divide by 2 in divider 30.

The expected variable frequency $f_V$ is related to the reference frequency $f_R$ by the frequency command word (FCW).

$$FCW[k] \equiv \frac{E(f_V[k])}{f_R} \quad (2)$$

The FCW is time variant and is allowed to change with every cycle $T_R = 1/f_R$ of the frequency reference clock. With $W_F=24$ the word length of the fractional part of FCW, the ADPLL provides fine frequency control with 1.5 Hz accuracy, according to:

$$\Delta f_{res} = \frac{f_R}{2^{W_F}} \quad (3)$$

The number of integer bits $W_I=8$ has been chosen to fully cover the GSM/EDGE and partial WCDMA band frequency range of $f_V=1,600-2,000$ MHz with an arbitrary reference frequency $f_R>8$ MHz.

The ADPLL operates in a digitally-synchronous fixed-point phase domain as follows: The variable phase accumulator 36 determines the variable phase $R_V[i]$ by counting the number of rising clock transitions of the DCO oscillator clock CKV as expressed below.

$$R_V[i] = \sum_{l=0}^{i} 1 \qquad (4)$$

The index i indicates the DCO edge activity. The variable phase $R_V[i]$ is sampled via sampler 38 to yield sampled FREF variable phase $R_V[k]$, where k is the index of the FREF edge activity. The sampled FREF variable phase $R_V[k]$ is fixed-point concatenated with the normalized time-to-digital converter (TDC) 42 output $\epsilon[k]$. The TDC measures and quantizes the time differences between the frequency reference FREF and the DCO clock edges. The sampled differentiated (via block 40) variable phase is subtracted from the frequency command word (FCW) by the digital frequency detector 18. The frequency error $f_E[k]$ samples $$f_E[k]=FCW-[(R_V[k]-\epsilon[k])-(R_V[k-1]-\epsilon[k-1])] \qquad (5)$$

are accumulated via the frequency error accumulator 20 to create the phase error $\phi_E[k]$ samples $$\phi_E[k] = \sum_{l=0}^{k} f_E[k] \qquad (6)$$

which are then filtered by a fourth order IIR loop filter 22 and scaled by a proportional loop attenuator α. A parallel feed with coefficient ρ adds an integrated term to create type-II loop characteristics which suppress the DCO flicker noise.

The IIR filter is a cascade of four single stage filters, each satisfying the following equation:

$$\gamma[k]=(1-\lambda)\cdot\gamma[k-1]+\lambda\cdot\chi[k] \qquad (7)$$

wherein
χ[k] is the current input;
γ[k] is the current output;
k is the time index;
λ is the configurable coefficient;

The 4-pole IIR loop filter attenuates the reference and TDC quantization noise with an 80 dB/dec slope, primarily to meet the GSM/EDGE spectral mask requirements at 400 kHz offset. The filtered and scaled phase error samples are then multiplied by the DCO gain $K_{DCO}$ normalization factor $f_R/\hat{K}_{DCO}$ via multiplier 26, where $f_R$ is the reference frequency and $\hat{K}_{DCO}$ is the DCO gain estimate, to make the loop characteristics and modulation independent from $K_{DCO}$. The modulating data is injected into two points of the ADPLL for direct frequency modulation, via adders 16 and 24. A hitless gear-shifting mechanism for the dynamic loop bandwidth control serves to reduce the settling time. It changes the loop attenuator α several times during the frequency locking while adding the $(\alpha_1/\alpha_2-1)\phi_1$ dc offset to the phase error, where indices 1 and 2 denote before and after the event, respectively. Note that $\phi_1=\phi_2$, since the phase is to be continuous.

The FREF input is resampled by the RF oscillator clock CKV via retimer block 46 which may comprise a flip flop or register clocked by the reference frequency FREF. The resulting retimed clock (CKR) is distributed and used throughout the system. This ensures that the massive digital logic is clocked after the quiet interval of the phase error detection by the TDC. Note that in the example embodiment described herein, the ADPLL is a discrete-time sampled system implemented with all digital components connected with all digital signals.

Figure 3:
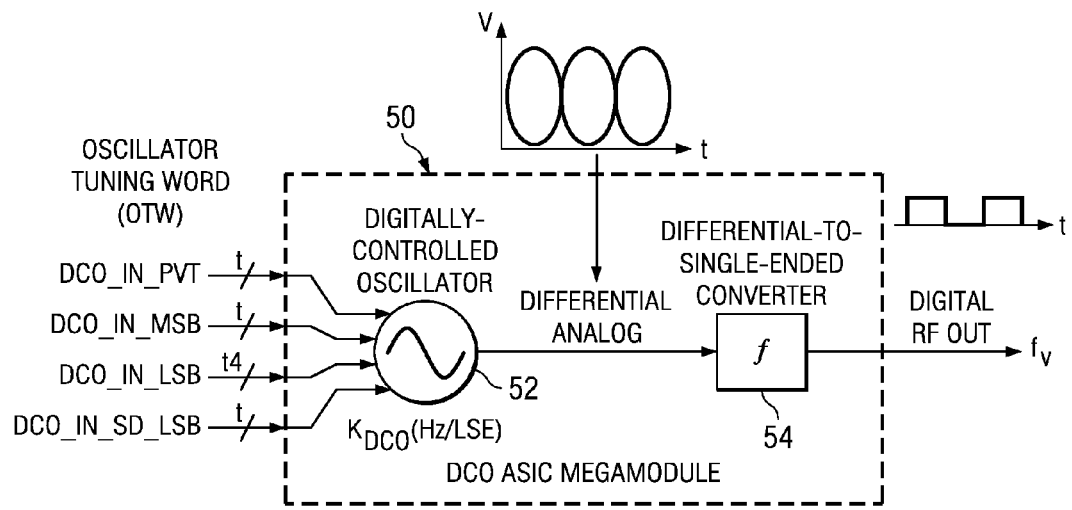
FIG. 3 is a block diagram illustrating a DCO module incorporating digital inputs and outputs.

A block diagram illustrating a DCO module incorporating digital inputs and outputs is shown in FIG. 3. The DCO module, generally referenced 50, comprises a DCO core circuit 52 and differential to single ended converter 54. The input to the DCO is an oscillator tuning word (OTW) comprising a plurality of PVT bits, and a unified bank comprising MSB, LSB and SD-LSB bits.

The quad band DCO is modulated by the oscillator tuning word (OTW) data stream to generate the phase (frequency) information for the PPA. It operates at twice (IMT2K, PCS, DCS) or four times (US cellular, EU cellular) band frequency. This gives the needed tuning range to have a single oscillator span all bands, as given in Table 1, while still providing excellent phase noise.

TABLE 1

Tx DCO Frequency Coverage of WCDMA Bands (in MHz)

| Band | Min. freq. | Max. freq. | ×2/×4 min. | ×2/×4 max. | Div ratio |
|---|---|---|---|---|---|
| IMT2K | 1920 | 1980 | 3840 | 3960 | 2 |
| PCS | 1850 | 1910 | 3700 | 3820 | 2 |
| DCS | 1710 | 1785 | 3420 | 3570 | 2 |
| EU-cellular | 880 | 915 | 3520 | 3660 | 4 |
| US-cellular | 824 | 849 | 3296 | 3396 | 4 |
| TDSCDMA I | 2010 | 2025 | 4020 | 4050 | 2 |
| TDSCDMA II | 1880 | 1920 | 3760 | 3840 | 2 |

Figure 4:
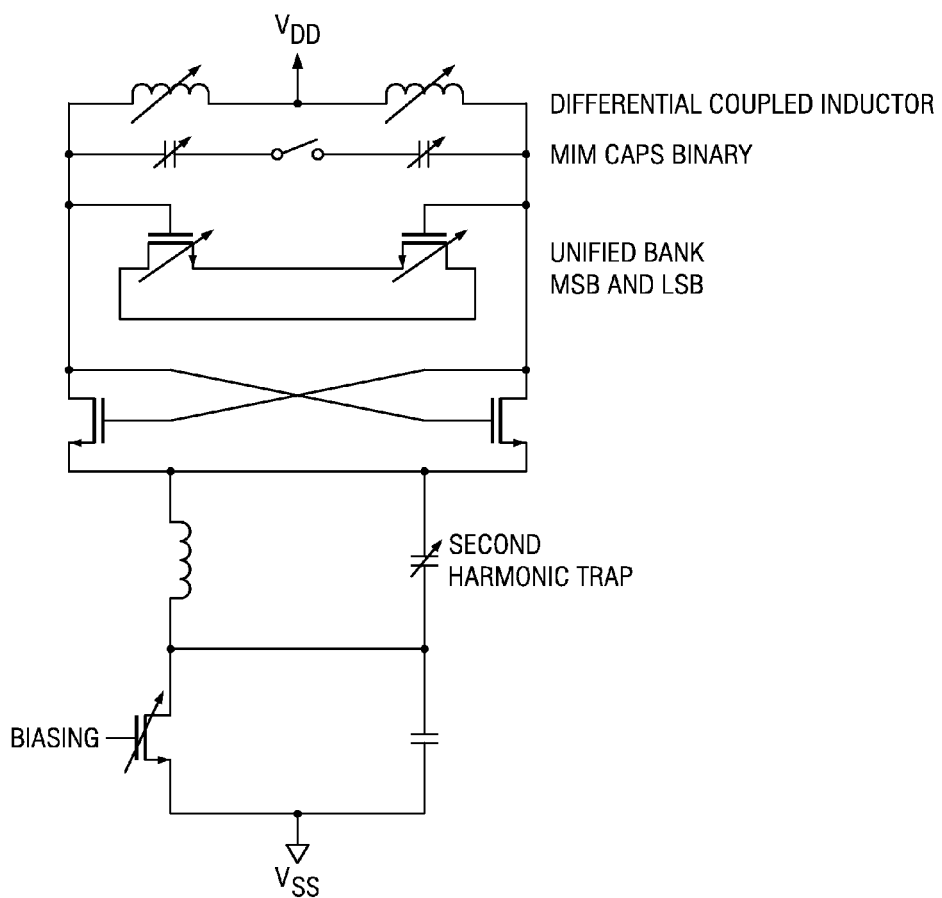
FIG. 4 is a schematic diagram illustrating the DCO core including the tunable capacitance and biasing network.

The DCO core contains a cross coupled gm core, LC tank, programmable MOS resistor current source and $2^{nd}$ harmonic trap (placed between the current source and the cross coupled pair), as shown in FIG. 4. The inductor of the DCO has a secondary loop around it which can be shorted to reduce the inductance and increase the maximum frequency of operation at the expense of a degradation in phase noise. This option is only exercised for a slow process corner and is not normally used. The capacitor bank comprises a coarse 7-bit MIM cap PVT bank spanning 3 GHz to 4.1 GHz at maximum MSB and a fine MOS capacitor bank for fine tuning and modulation. The MIM capacitor bank is binary-coded consisting of 6 full bits and 1 half bit providing an average of 10 MHz/bit. The MIM capacitors have a unit size of 33 fF with a ±25% variation. The DCO current consumption is below 8 mA and its tuning range is greater than 27%.

To meet the requirements of both a wider modulation tuning range and fine resolution, a single segmented Unified Bank (UB) of MOS capacitors has been adopted. The Unified Bank uses pairs of MOS devices with their gates tied to the oscillation nodes and their drains and sources shorted and driven either low or high to switch the devices on or off. It is divided into a 128-bit thermometer coded MSB bank (spanning 250 MHz) and a 16-bit thermometer coded LSB bank sized to give nominally 120 kHz/LSB. Because of the $1/\sqrt{LC}$ dependence of frequency, this step size and coverage is band frequency dependent (PVT bank setting). The Unified Bank allows for a much fewer number of control lines and a more compact layout, minimizing parasitic capacitance. This maximizes the DCOs maximum frequency and minimizes phase noise.

The oscillating frequency of the DCO is controlled by the use of a plurality of weighted binary switchable capacitance devices, i.e. varactors. An array of varactors is switched into either a high capacitance mode or a low capacitance mode individually by a two level digital control signal. In order to provide sufficient dynamic range, the process of locking the PLL involves traversing through three major operational modes with progressively lower frequency range and higher resolution.

In the first step, the large oscillating frequency due to the process-voltage-temperature (PVT) variations is calibrated using the PVT capacitor bank. Following the PVT calibration, the nominal center frequency of the oscillator will be within an equivalent of the PVT varactor size (a few megahertz) of the desired band. The second step is to acquire the requested operational channel accurately within the available band using the Unified capacitor bank. Initially the MSB varactors are switched in/out followed by the LSB bank. The third step is the finest, but with the most narrow-band range, and functions to track the frequency reference and to perform data modulation within the channel using the Unified capacitor bank. Note that during the initial locking phase using PVT and the unified MSB/LSB operation, the frequency range to be spanned before lock is relatively high but the required precision is relatively low.

In the DCO, the fine grain frequency control is achieved by switching in tiny inversion-type CMOS varactors. For deep submicron processes, the inversion type device is a better varactor candidate due to (1) the well isolation properties in the n-well process and (2) the more distinctly-defined operational regions than an accumulation-type varactor. Unlike the standard CMOS varactors, the linear range of a deep-submicron varactor is compressed and has undesirably high gain, which makes the RF oscillator extremely susceptible to noise and possible shift in the operating point. For tuning operation, the flat on-state region of the depletion mode and the flat off-state region of the inversion mode are used as two stable binary-controlled operating points.

The CMOS varactors employed during the modulation phase tracking operation are chosen to have small feature size optimized to allow for the finest grain frequency control possible while maintaining the modulation range needed for WCDMA modulation. Further fine-grain control is achieved using fractional high speed sigma-delta modulator. For the DCO unified bank, the switchable capacitance of the finest differential least significant bit (LSB) varactor is on the order of tens of attofarads. Matching of these minimum dimension varactors is important for the DCO to ensure monotonic linear tuning characteristics. It is well-known that, as the physical transistor dimensions shrink, mismatch variance may increase as a result of fluctuations in dopant or geometry. Advanced CMOS process lithography today, however, allows for the creation of extremely small-sized but very well-controlled varactors.

The example DCO presented herein has been realized in 90 nm technology optimized for short-channel thin-oxide devices operating as digital switches at only 1.2 V. The DCO is architected to use a continuous-time, continuous-amplitude analog oscillator core embedded in a digital wrapper to realize a digitally controlled oscillator (DCO). This prevents the analog nature of the DCO from propagating to the consequent stages. The frequency output of the LC tank (not shown) in the DCO, can be controlled by either changing the inductance or the capacitance. In a monolithic implementation, however, it is more practical to keep the inductor fixed while changing the capacitance of a voltage-controlled device, such as a varactor. Since the digital control of the capacitance is required, the total capacitance is quantized into a number of digitally controlled varactors, which do not necessarily follow the binary-weighted pattern of their capacitance values. In order to achieve both a wider oscillator tuning and modulation bandwidth as well as achieve the fine frequency control needed for GSM/EDGE/UMTS class operation, the LC tank capacitance has been realized by three different quantization banks of capacitors. Namely, a coarse MIM-type Process, Voltage and Temperature (PVT) calibration bank (PB), an extended Unified Bank (UB), comprising MSB (16×) and LSB (1×) MOS-CAP varactors.

The MSB bank drives 128 16× devices while the LSB bank drives 15 1× devices. Three additional 1× SD-LSB devices are available for sigma-delta dithering to obtain the fine frequency step needed while shaping the DCO quantization noise. The sigma-delta has a 6-bit input (i.e. 64 levels) and an either 1 (for $1^{st}$ order $\Sigma\Delta$) or 3 (for $2^{nd}$ order $\Sigma\Delta$) bit output.

In normal DCO operation, the MSB and LSB banks are centered and the PVT bank is moved to get to the closest desired channel frequency. Then the MSB and LSB bits are moved to lock the channel frequency. During modulation only the MSB, LSB and SD-LSB bits are changed. After cycling through 15 LSB bits, a single additional MSB bit is turned on and all LSB bits are turned off.

At any instant, the total capacitance contributed by the three DCO banks: PB, MSB and LSB is given by the following:

$$C = C_{0,tot} + \sum_{k=1}^{N} \overline{d}_k \cdot \Delta C_k \cdot 2^k \qquad (8)$$

where $C_{0,tot}$ includes all the parasitic static shunt capacitances due to the varactors in the low-capacitance 'on' state, N is the total number of varactors in the tuning banks, $\overline{d}_k$ is the complement of the digital control word for the $k^{th}$ varactor while $\Delta C_k$ is its capacitive contribution. After initial calibration for the PVT and the acquisition bank, mostly only UB is active during the DCO tracking operation, therefore Equation 7 can be re-expressed as follows $$C = C^P + C_0^M + C_0^L + \sum_{k=1}^{N^M} \overline{d}_k^M \Delta C_k^M + \sum_{k=1}^{N_L} \overline{d}_k^L \Delta C_k^L \qquad (9)$$

where $C^P$ is the capacitive contributions of the PVT bank, $C_0^M$ and $C_0^L$ are the sum of the shunt capacitances of the MSB and LSB bank varactors, respectively. $N^M$ and $N^L$ are the total number of Unified bank MSB and LSB varactors, $\overline{d}_k^M$, $\overline{d}_k^L$ is the inverted select bit for the $k^{th}$ MSB or LSB bank varactor and $\Delta C_k^M$, $\Delta C_k^L$ are the switchable capacitance of the $k^{th}$ unit-weighted MSB and LSB tracking varactor, respectively.

Figure 5:
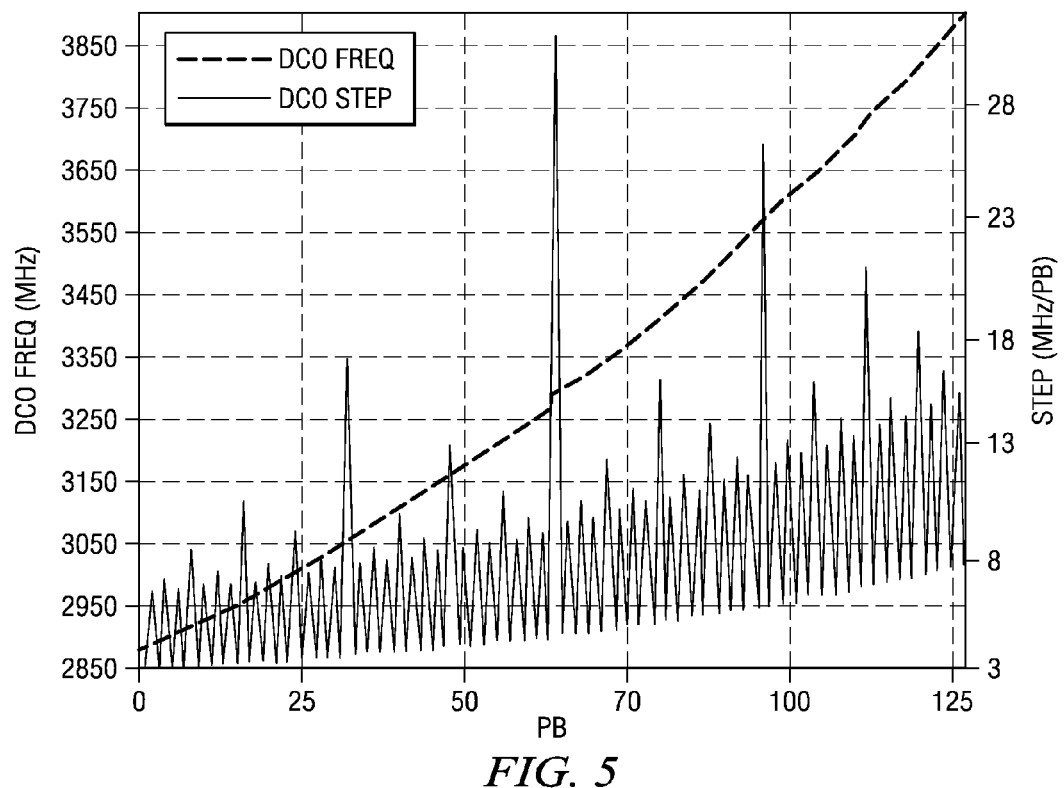
FIG. 5. is a graph illustrating DCO output frequency and step size as a function of PVT bank bits for a mid MSB and LSB setting.
Figure 8:
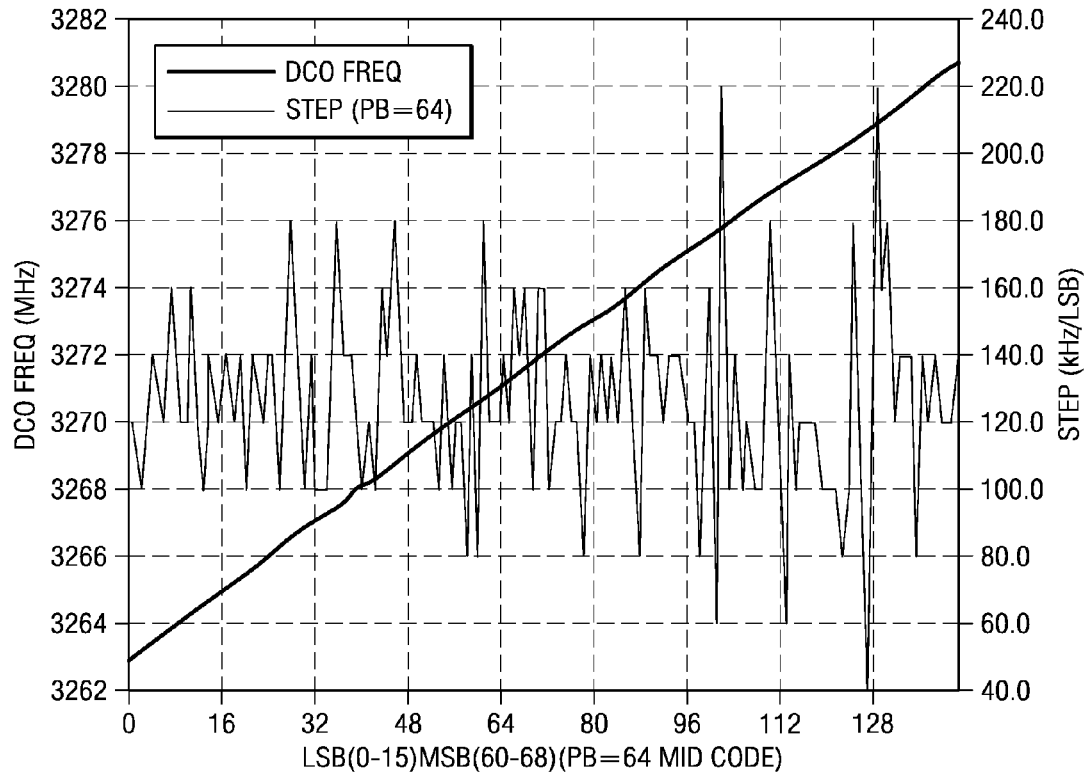
FIG. 8 is a graph of the DCO output frequency and step size versus DCO frequency command code.

A graph of the DCO output frequency and step size versus DCO frequency command code is shown in FIG. 8. The graph illustrates the DCO output frequency and LSB step size for an LSB (0-15) and mid MSB setting (i.e. 60-68) sweep for a fixed PVT setting. Note that care should be taken in the physical design of the MSB/LSB banks so as to maintain the ratio of capacitance between them. Since the LSB devices are fewer and in close-proximity of each other, the variations between them are relatively minor. On the contrary, the MSB/LSB ratio mismatches are a function of systematic differences in the sizes due to physical device geometry and are more significant. The graph in FIG. 5 illustrates measured results on the DCO output frequency when transitioning from LSBs to MSBs. The measurement is taken at a fixed setting on the coarse process bank and around a mid setting on the MSB devices.

From the graph of FIG. 8, it can be seen that the output is monotonic and a very good match has been achieved between LSBs and MSBs ensuring good INL and DNL. At certain transition points (e.g., 80 and 128), however, the delta step size changes rapidly (second derivative) implying a systematic mismatch between LSBs and the particular MSB being turned on. Such a mismatch may lead to error vector magnitude (EVM) degradation as well as degraded modulated spectrum and ACLRs. This is due to the worsening of the effective frequency quantization noise. It can be digitally calibrated out using the pre-distortion scheme of the present invention, where the LSB steps are adjusted to account for the mismatch between the MSB/LSB step sizes as long as the difference is known.

Figure 6:
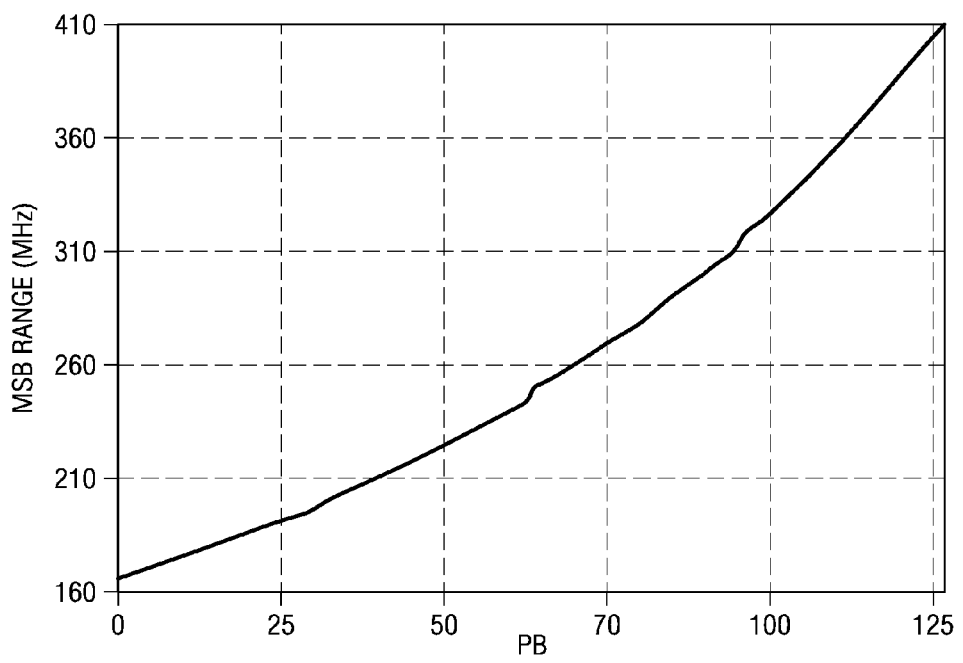
FIG. 6. is a graph illustrating MSB range as a function of PVT bank bits for a mid MSB setting.
Figure 7:
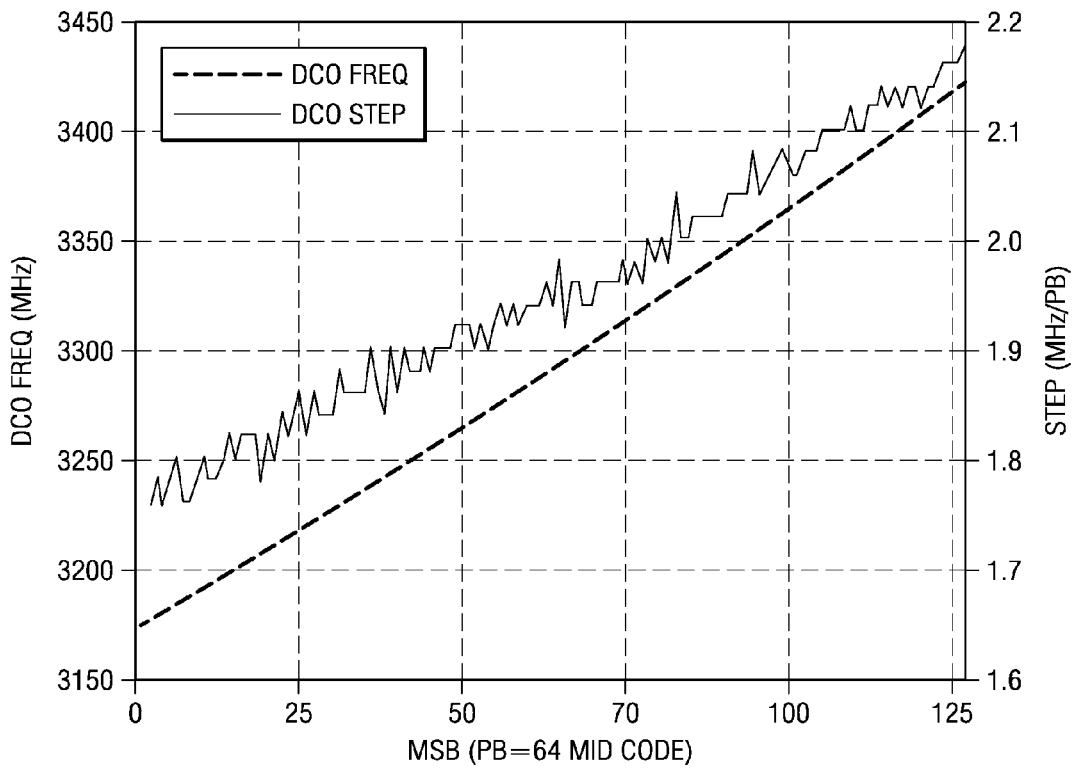
FIG. 7. is a graph illustrating DCO output frequency and LSB step size for LSB (0-15) and MSB (60-68) sweep for a fixed PVT setting.

FIG. 6 shows the measured frequency range of the MSB bank as a function of PVT bits. The MSB range is defined as the frequency delta between all MSBs on and all MSBs off. FIG. 7 shows the measured DCO output frequency and step size as a function of MSB bits for a mid setting on the PVT bank.

Note that the critical modulated phase noise spec for 3G transmitters is based upon the RX band offset. This varies from 190 MHz for IMT2K to 45 MHz for US cellular. The DCO phase noise at these offsets is designed to fall well below the divider noise floor with divider gain factored in.

Figure 9:
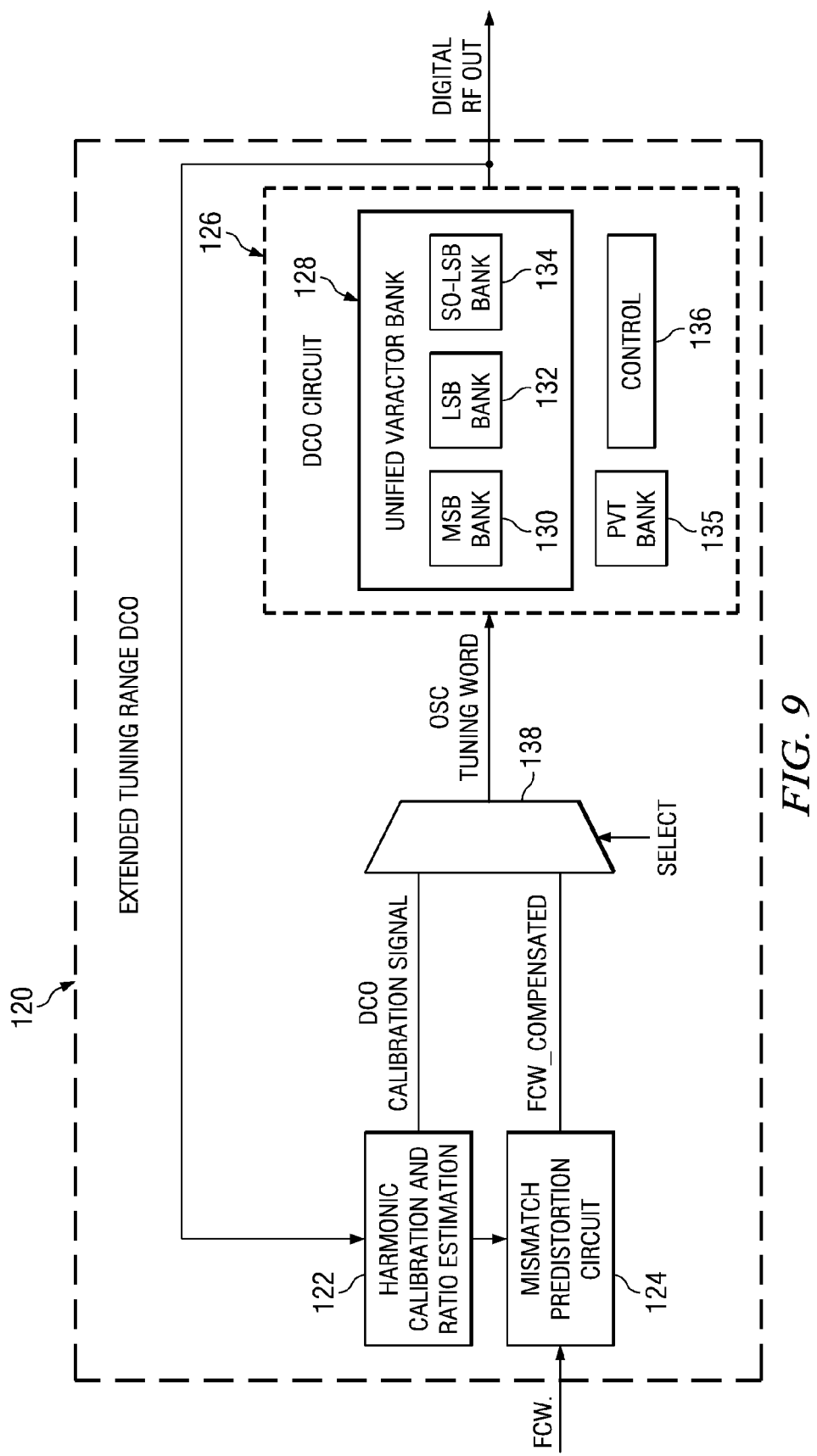
FIG. 9 is a block diagram illustrating the extended tuning range and enhanced resolution DCO circuit designed in accordance with the present invention.

A block diagram illustrating the extended tuning range and enhanced resolution DCO circuit constructed in accordance with the present invention is shown in FIG. 9. The DCO with extended tuning range (and enhanced resolution), generally referenced 120, comprises a DCO circuit 126, mismatch pre-distortion circuit 124, harmonic calibration and radio estimation circuit 122 and multiplexer 138. The DCO circuit 126 comprises a PVT bank, a unified varactor bank 128 and control circuit 136. The unified varactor bank 128 comprises an MSB bank 130, LSB bank 132 and SD-LSB bank 134.

To meet the requirements of both a wider modulation tuning range and finer resolution (for 3G cellular standards such as WCDMA), a single segmented unified bank of MOS capacitors 128 is used in the DCO circuit. The unified varactor bank uses pairs of MOS devices with their gates tied to the oscillation nodes and their drains and sources shorted and driven either low or high to switch the devices on or off. In the illustrative example presented herein, the unified bank is divided into a 128-bit 16× thermometer coded MSB bank 130 (spanning 250 MHz) and a 16-bit 1× thermometer coded LSB bank 132 sized to yield 120 kHz/LSB. Because of the $1/\sqrt{LC}$ dependence of frequency, this step size and coverage is band frequency dependent (PVT bank setting). The unified bank allows for a much fewer number of control lines and a more compact layout, minimizing parasitic capacitance. This maximizes the maximum frequency of the DCO and minimizes phase noise.

In normal DCO operation, the MSB and LSB banks are centered and the PVT bank is moved to get to the closest desired channel frequency. The MSB and LSB bits are then moved to lock the channel frequency. During modulation only the MSB, LSB and SD-LSB bits are changed. After cycling through 15 LSB bits, a single additional MSB bit is turned on and all LSB bits are turned off.

Figure 10:
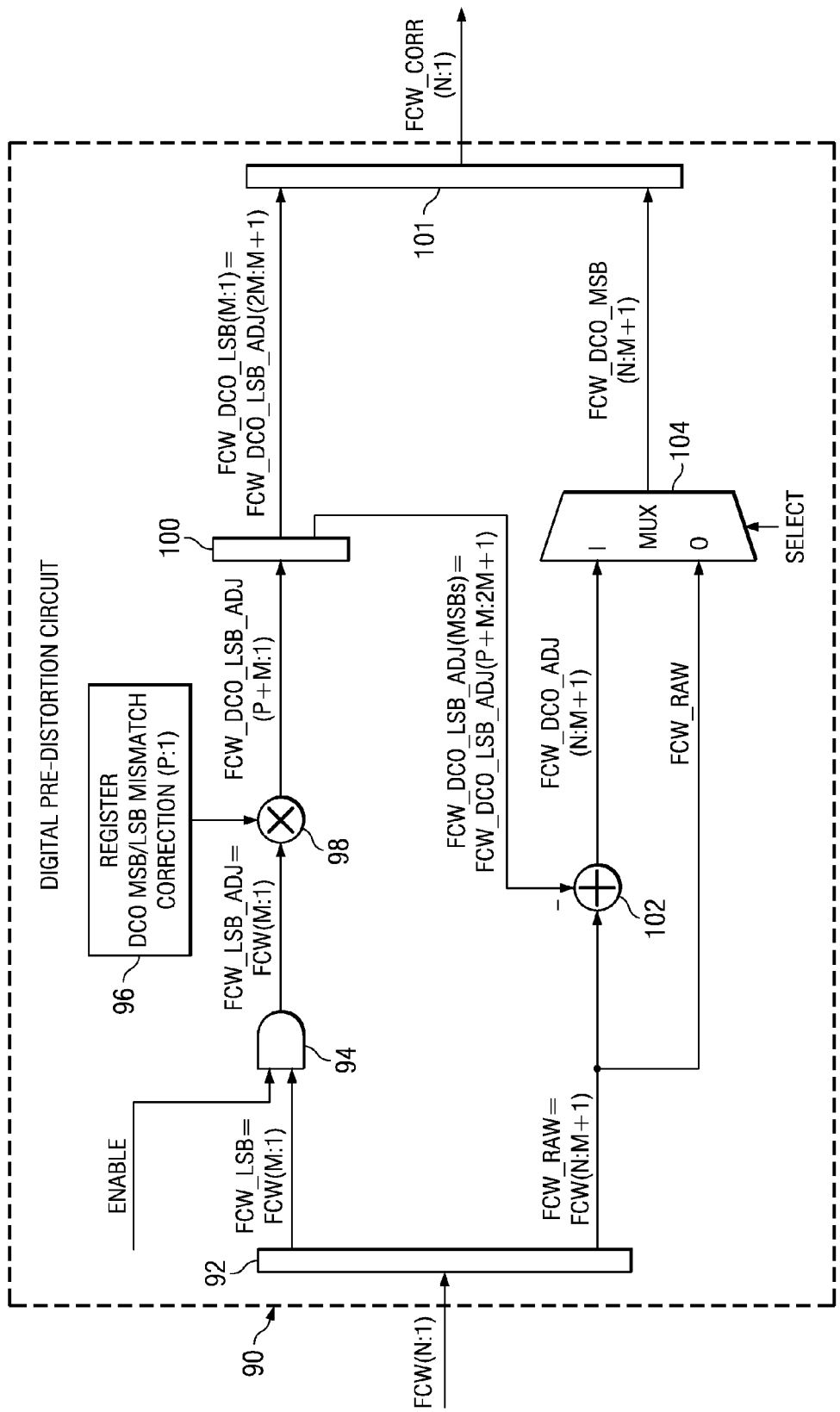
FIG. 10 is a block diagram illustrating the digital predistortion circuit for countering DCO MSB/LSB mismatch constructed in accordance with the present invention.

A block diagram illustrating the digital predistortion circuit for countering DCO MSB/LSB mismatch constructed in accordance with the present invention is shown in FIG. 10. The digital predistortion circuit, generally referenced 90, comprises DCO MSB/LSB mismatch correction 96, multi-plier 48, adder 102, multiplexer 104 and AND gate 94. In operation, the MSB/LSB mismatch correction 96 generated by the harmonic calibration and ratio estimation circuit 122 (FIG. 9) (when enabled) is applied to the LSBs of the frequency control word (FCW) adjustment to generate an FCW_DCO_LSB_ADJ signal. The MSBs of this signal are subtracted from the raw FCW to generate the FCW_DCO_ADJ signal. Depending on the state of the select control input, the multiplexer outputs either the FCW_DCO_ADJ signal or the raw FCW (FCW_RAW) as the MSBs of the corrected FCW (FCW_CORR) signal. The LSBs in this case are taken from the FCW_DCO_LSB_ADJ.

Note that this circuit assumes that the difference between the MSB/LSB step sizes is known. The MSB/LSB mismatches between the varactors can be measured in the laboratory but this is typically a time consuming process and amendable to measurement errors. The invention provides a harmonic calibration method that is used to determine the average MSB/LSB mismatch. The mismatch value is used to correct the LSB steps using the circuit of FIG. 10.

The harmonic characterization technique uses a sinusoidal modulation that is applied to the DCO. The unequal DCO frequency step sizes will dominantly result in the creation of even harmonics in the observable frequency modulated RF spectrum. The level of the $2^{nd}$ harmonic is the most significant of these and is used as a measure to estimate the MSB/LSB mismatch in the DCO unified varactor bank. The magnitude of the applied sine wave is tuned to average over a conveniently large number of MSB device combinations.

To ensure adequate transmitter quality, not only it is imperative to use digitally-intensive signal processing techniques to compensate for any analog imperfections in the deep-submicron RF integration, but it is also preferable to design analog modules in a fashion so as to achieve predictable performance reliably across various lots in volume production. The mismatch analysis of fabrication varactor thus is a pivotal step for DCO reliability analysis. For the sake of VHDL modeling, the unified bank varactors are modeled according to the relation $$C_{eff}^U = C_{nom}^U + C_{sys}^U + C_{rand}^U \qquad (10)$$

where $C_{nom}^U$ is the nominal value of the capacitance, $C_{sys}^U$ represents the systematic error in the value due to oxide thickness variations and process gradients, etc., and $C_{rand}^U$ is the random Gaussian distributed error in the physical geometry of the varactors due to the lithographic and other process errors.

Due to the compact physical layout of the instant DCO, the contribution of systematic errors has been found to be insignificant. Further, there are physical complexities involved in the estimation of systematic error contributions to the varactor capacitance. Therefore, all the capacitance errors were modeled as Gaussian distributed with the magnitude of random errors controlled by the standard deviation of the Gaussian density function.

To study the effect of mismatches via standard VHDL modeling, the effect of these capacitance value errors may be introduced in the time-domain model of the DCO as instantaneous frequency deviation. It has been shown that during the tracking mode of DCO operation using the unified bank, the instantaneous frequency step $\Delta f^U$ is substantially directly proportional to the change in the capacitance value $\Delta C_U$, i.e. $\Delta f^U(f) \propto \Delta C^U$. All the random errors were generated at the beginning of a VHDL simulation and were kept constant throughout the simulation. The standard deviation for the mismatches was varied as a percentage of the nominal DCO gain slope of the tracking (i.e., unified) bank varactors.

Figure 15A:
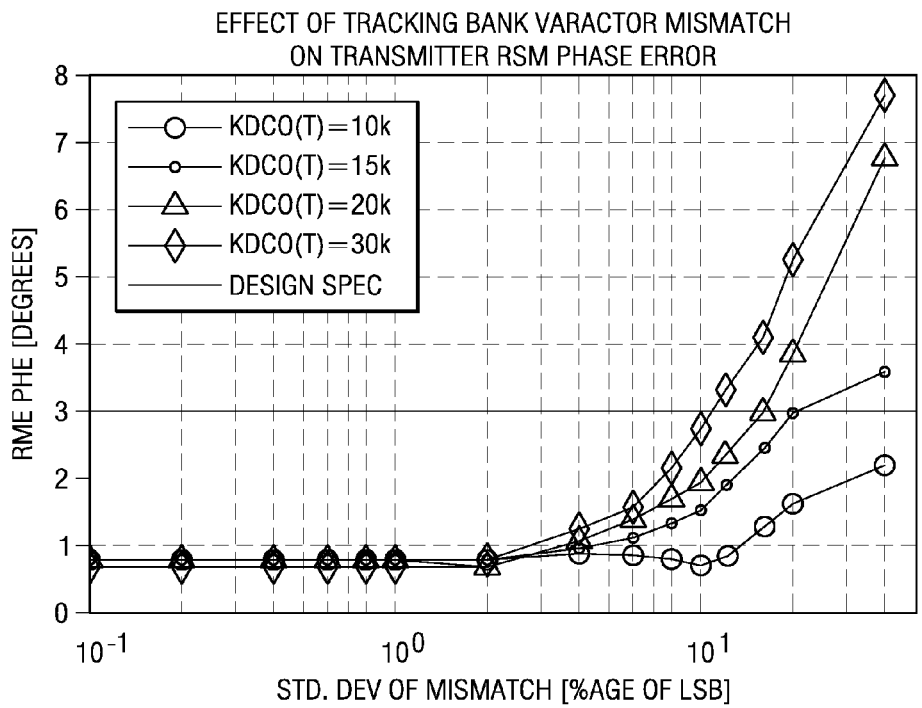
FIG. 15A is a graph illustrating the RMS Phase Error as a function of DCO varactor mismatches.
Figure 15B:
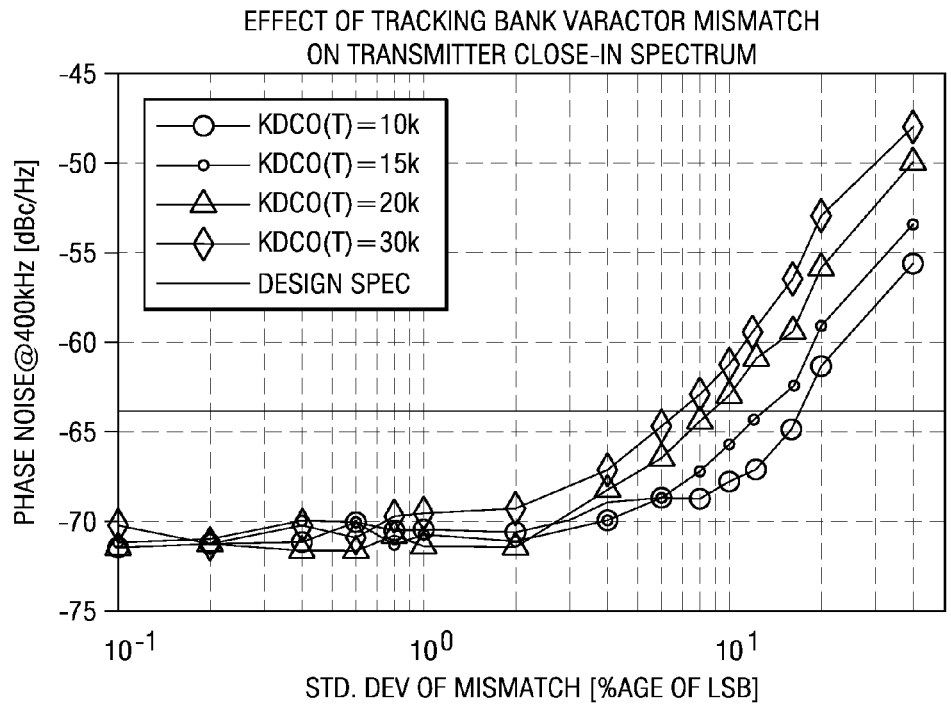
FIG. 15B is a graph illustrating the Modulated Phase Spectrum at 400 kHz as a function of DCO varactor mismatches.

For initial investigation purposes, the analog DCO model with varactor mismatch modeling was integrated into the full-scale RTL (and gate-level) GSM/EDGE/UMTS transmitter models. The goal was to determine the maximum tolerable level of varactor mismatches without violating the target specifications. Several regressions using modulated data were run to determine the quantitative performance degradation caused by the varactor mismatches. For example, in case of GSM, the simulated regression results showed that the varactor mismatches did not significantly affect the far-out phase spectrum of the transmitter. Rather, the main degradation was observed in the close-in spectrum as well as in the RMS phase error of the demodulated signal. FIGS. 15A and 15B illustrate the degradation of the root mean squared (RMS) phase error and modulated phase noise at 400 kHz offset from the carrier, which is considered the most challenging in the GSM specification. The results are tabulated as a function of the standard deviation of varactor mismatch expressed as a percentage of UB nominal minimum frequency deviation step. Another observation garnered from these graphs is that a relatively larger mismatch can be tolerated if the tracking bank varactors have a relatively smaller frequency step size.

In accordance with the invention, a harmonic calibration technique is used to physically assess the amount of varactor mismatch in the unified bank. The technique is based on the notion that the DCO tracking bank with its varactor mismatches can be treated as a synchronous noisy quantizer. The synchronism is due to the clocked feeding of modulation data to the DCO input ports, whereas the noise in the quantizer is due to the physical mismatches in the geometry of deep submicron varactors as a result of fabrication process tolerances. A simple mathematical model is described below.

For a band-limited modulation signal m(t), which is uniformly quantized at the rate $1/T_S$. The $n^{th}$ quantized modulation sample $\hat{m}(n); -\infty < n < \infty$, has a quantization step $\Delta$, given by $\Delta = m_{max} - m_{min}/2^{B+1} \cong M/2^B$, where $\{m_{max}, m_{min}\}$ are the maximum and minimum modulation values, M=max(abs $(m_{max}, m_{min}))$ is the maximum (positive or negative) range of the signal and B+1 is the number of bits used in the quantizer codeword. In general, using 2's complement number representation, the quantizer fraction is coded as $\hat{m}_B(n) = -a_0 2^0 + a_1 2^1 + \ldots + a_B 2^{-B}$. Therefore $\hat{m}_B(n)$ is always in the range $-1 \leq \hat{m}_B(n) < 1$ and the quantized sample is $\hat{m}(n) = M \hat{m}_B(n)$ or $\hat{m}(n) \propto \hat{m}_B(n)$.

For convenience, $\hat{m}(n)$ may be thermometer encoded, which is suitable if each bit in the codeword is used to physically control a frequency control device, such as a varactor in the DCO that is being turned on or off. Defining the quantization to be a functional, say Q, we can express $\hat{m}(n)$ as $$\hat{m}(n) = Q(m(n)) \quad (11)$$

where m(n) is in the range $-(M+\Delta/2) < m(n) < M+\Delta/2$. The error e(n) in the quantized signal is given by $$e(n) = m(n) - \hat{m}(n) = m(n) - Q(m(n)) \quad (12)$$

Figure 13A:
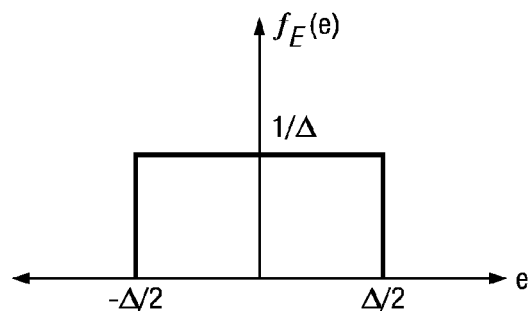
FIG. 13A is a diagram illustrating the quantization density function for an ideal uniform quantization.
Figure 13B:
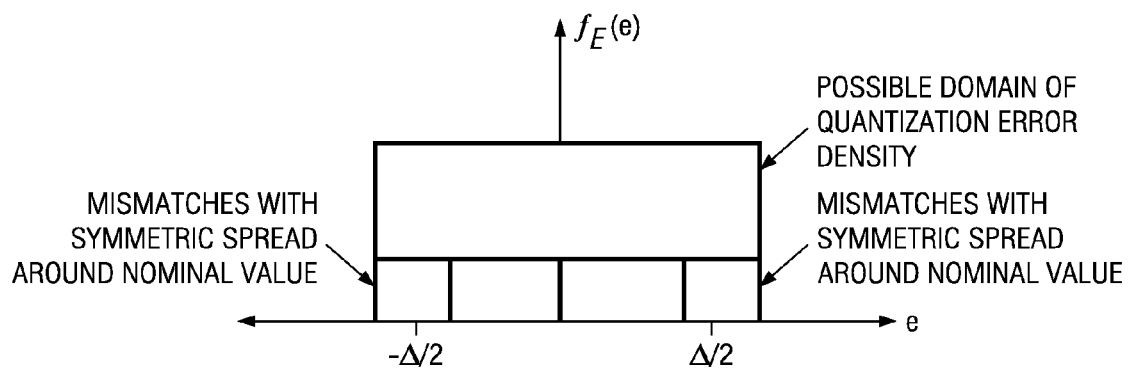
FIG. 13B is a diagram illustrating the quantization density functions for a quantizer with noisy quantization levels.

For an ideal uniform quantizer, e(n) is uniformly distributed as shown in FIG. 13A. Due to the physical limits of fabrication process, however, the DCO varactors have mismatches and therefore e has an arbitrary density function loosely defined in FIG. 13B. Observe that due to noisy quantization levels, the $f_E(e)$ probability density function (pdf) has boundaries which may have a symmetric or asymmetric spread around the nominal value. Depending on the physics of the fabrication process, the mismatches may or may not have a mean of zero and the spread of the quantization pdf boundary becomes a function of mismatch variance $\sigma_{mism}^2$. Consequently, the value of the probability density function is not a uniform value across the range of e, rather it can take any possible profile satisfying the pdf constraints in the domain shown in FIG. 13B.

Figure 11:
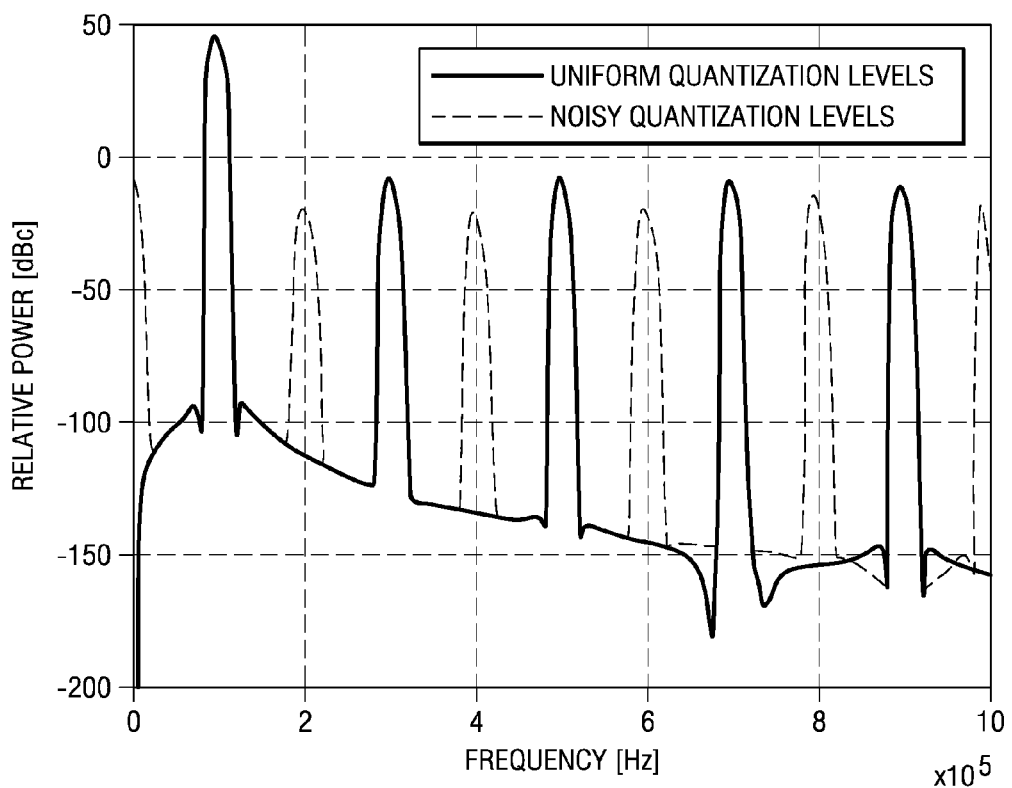
FIG. 11 is a graph illustrating the spectrum for uniform and noisy quantization levels in harmonic characterization of varactor mismatches in the DCO.

As a result of the above described artifacts, a sinewave passed through a noiseless quantizer produces an output comprising the fundamental frequency plus the odd harmonics only. If the quantizer has noise in the quantization levels, however, the output will comprise even as well as odd harmonics. This effect has been captured for a sinusoidal input signal of 100 kHz sampled at 1 GHz in FIG. 11.

Figure 12:
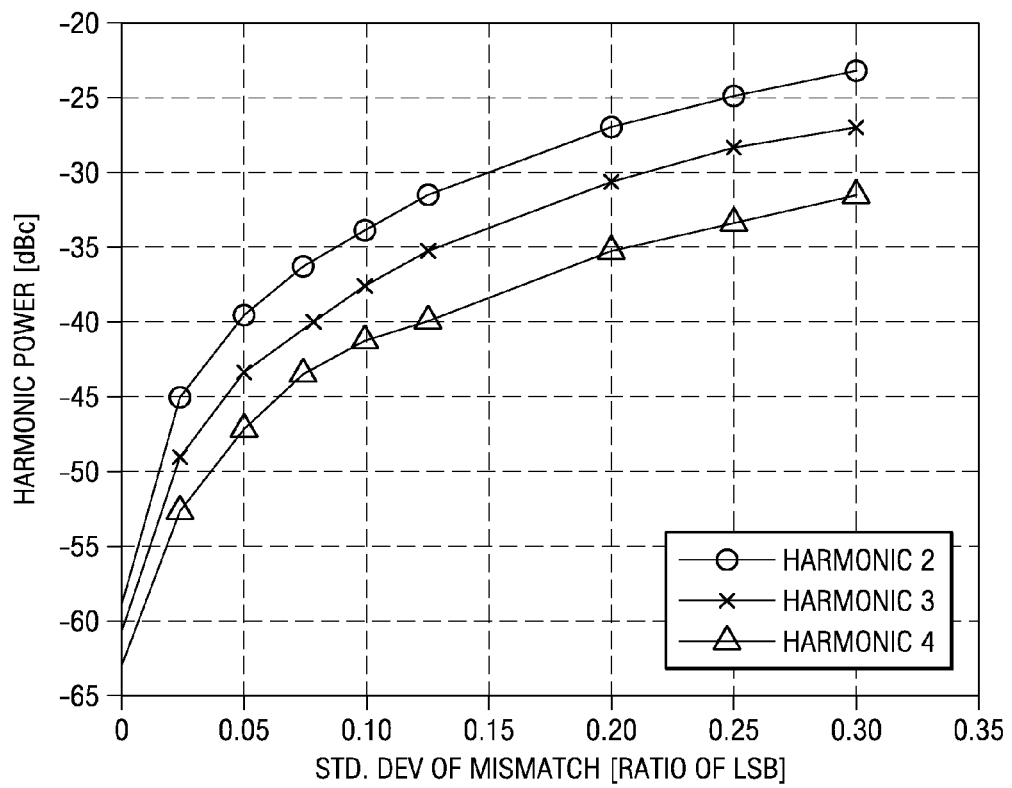
FIG. 12 is a block diagram illustrating the effects of the unified LSB (or tracking) bank varactor mismatch on frequency modulation harmonics using a 203 kHz sine wave modulating tone.

The amplitude of these even harmonics and the amount of change that is observed in the odd harmonics has been experimentally verified to be dependent on $\sigma_{mism}^2$. The invention takes advantage of this phenomenon to provide an efficient, low complexity and fast characterization technique to determine the physical mismatches in the unified bank (UB) MSB and LSB varactors of the DCO. The spectral amplitude of these even harmonics can be used as a metric to determine the amount of mismatch in the quantization levels. FIG. 12 presents the results of recording the amplitude of the first three harmonics as a function of the modeled LSB varactor mismatches using a sinewave of 203 kHz for modulation. The harmonics can be autonomously measured using RF-BIST techniques described infra.

Figure 14:
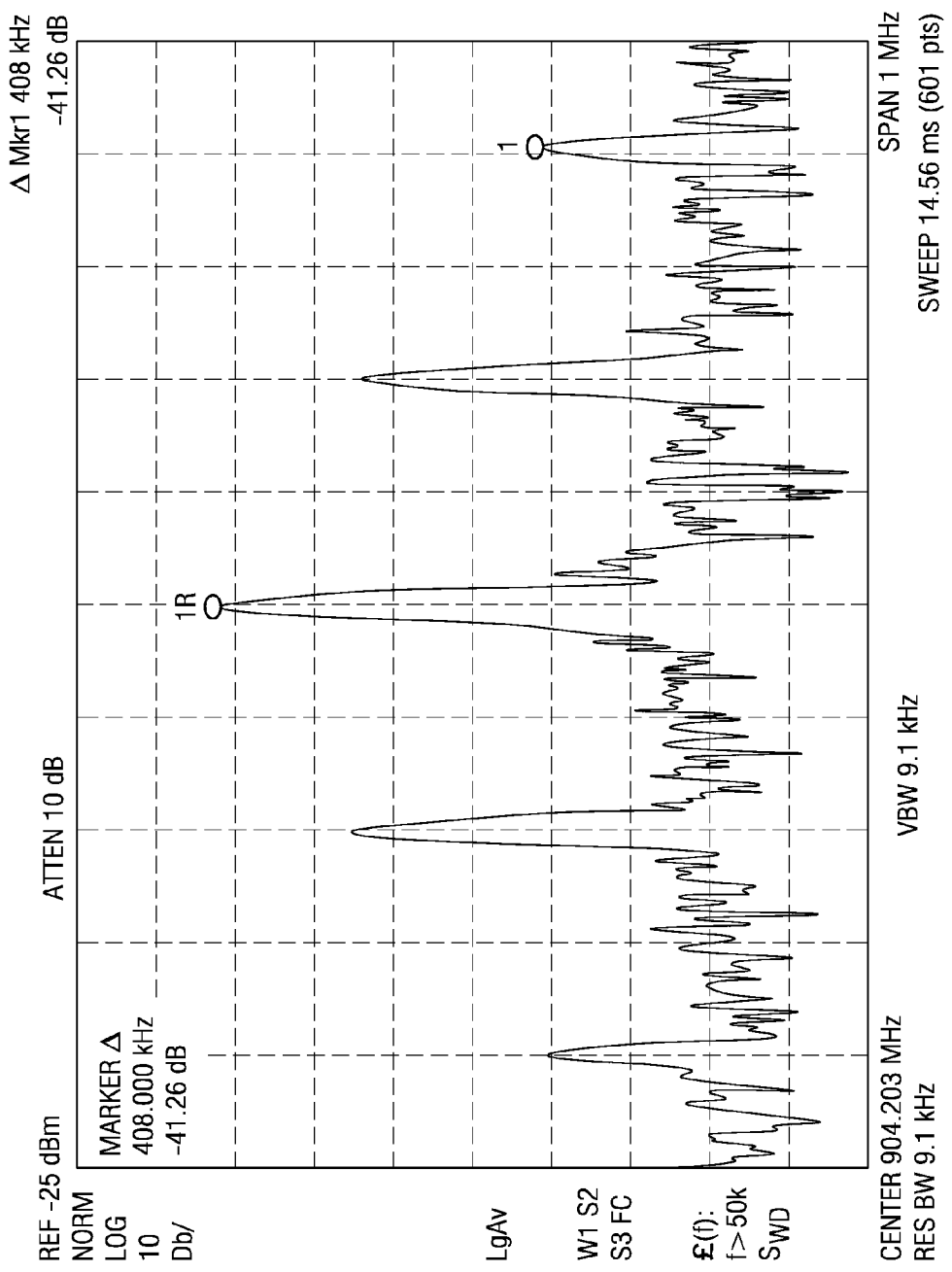
FIG. 14 is a graph illustrating laboratory measurements taken on a physical GSM transceiver chip demonstrating the benefits of the present invention.

FIG. 14 shows a laboratory measurement using a spectrum analyzer indicating the amplitude of the second harmonic observed by application of a 203 kHz sinewave modulation to an actual GSM transmitter integrated circuit (IC).

It can be seen that a −41.26 dB level of second harmonic corresponds to approximately 5% of standard deviation in the varactors constructed using the 90 nm CMOS process. Further, laboratory measurements were carried out on several GSM chips to measure the 400 kHz offset modulated phase noise (PN) and the RMS phase error across all GSM channels at various temperatures. The average of the laboratory measurements has been tabulated and presented in Table 2.

TABLE 2

| Laboratory Measurements | | |
|---|---|---|
| | Measured Results | Specification |
| Average PN @ 400 kHz | −68.9 dBc | −60 dBc |
| Average RMS Phase Error | 0.96° | 3° |

The laboratory results upon correlation with the characterization graphs of FIGS. 15A and 15B indicate the varactor mismatches to be smaller than 5%. These characterized values are superior to the statistical mismatch estimates based on typical 90 nm process data.

The harmonic levels can also be autonomously detected using a built-in self-test (BIST) method based on the observation of the internal phase error signal. The BIST method is described in detail in US Patent Publication No. US2004/0146132 to Staszewski et al., entitled "Radio Frequency Built-In Self Test For Quality Monitoring Of Local Oscillator And Transmitter," incorporated herein by reference in its entirety.

The mismatch adjustment operation can be performed iteratively in a BIST manner similar to that described in U.S. patent application Ser. No. 11/460,221 to Waheed et al., entitled "Hybrid Stochastic Gradient Based Digital Controlled Oscillator Gain KDCO Estimation," incorporated herein by reference in its entirety. For observability, the internal phase error signal (or its derivative) could be observed to ascertain the value of the second harmonic while the ratio mismatch adjustment "knob" is varied.

It should be noted that the methods and techniques presented herein apply to a general class of a digital-to-analog converter (DAC), where the 'A' in 'DAC' denotes any analog quantity (e.g., voltage, current, resistance, capacitance, frequency, power, etc). The digitally-controlled conversion devices could also be arranged using a similar technique of using a segmented unified bank as described herein, in which each sub-bank comprises a number of the unit-weighted devices. In the embodiments described supra, the analog quantity ('A' in 'DAC') is capacitance, which gets further converted into frequency deviation through the LC resonating tank-based oscillator. The conversion device is a varactor.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. An apparatus for extending the frequency tuning range of a digitally controlled oscillator (DCO), comprising:
    a single segmented unified tuning bank comprising:
        a coarse tuning bank comprising a plurality of coarse tuning devices adapted to provide coarse frequency tuning control of said DCO;
        a fine tuning bank comprising a plurality of fine tuning devices adapted to provide fine frequency tuning control of said DCO; and
    a pre-distortion circuit operative to compensate a DCO input signal for mismatches between said coarse tuning devices and said fine tuning devices to yield a compensated DCO input signal thereby.

2. The apparatus according to claim 1, wherein said coarse tuning devices comprise inversion-type Complementary Metal Oxide Semiconductor (CMOS) tuning varactors.

3. The apparatus according to claim 1, wherein said coarse tuning bank comprises a 128-bit thermometer coded most significant bit (MSB) tuning bank.

4. The apparatus according to claim 1, wherein said coarse tuning bank comprises a 128-bit thermometer coded most significant bit (MSB) tuning bank of 128 16X devices.

5. The apparatus according to claim 4, wherein each said 16X device comprises a combination of 16 1X devices.

6. The apparatus according to claim 1, wherein said fine tuning devices comprise inversion-type Complementary Metal Oxide Semiconductor (CMOS) tuning varactors.

7. The apparatus according to claim 1, wherein said fine tuning bank comprises a 16-bit thermometer coded least significant bit (LSB) tuning bank.

8. The apparatus according to claim 1, wherein said fine tuning bank comprises a 16-bit thermometer coded least significant bit (LSB) tuning bank of 16 1X devices.

9. The apparatus according to claim 1, wherein said unified tuning bank further comprises a sigma-delta least significant bit (SD-LSB) tuning bank having a plurality of 1X devices.

10. The apparatus according to claim 1, wherein said pre-distortion circuit comprises means for adjusting said DCO input in accordance with a mismatch error value and adding a product generated thereby to said DCO input to generate said compensated DCO input signal.

11. The apparatus according to claim 10, wherein said mismatch error value is dynamic.

12. The apparatus according to claim 10, wherein the average of said mismatch error value is assumed same for all the fine tuning devices within the said fine tuning bank.

13. The apparatus according to claim 10, wherein said mismatch error value is computed a priori for all tuning devices within said single segmented unified tuning bank and stored in a table.

14. The apparatus according to claim 10, further comprising harmonic calibration means operative to determine said mismatch error value.

15. The apparatus according to claim 1, wherein said coarse tuning devices and said fine tuning devices are closely matched to provide monotonic frequency transition.

16. An apparatus for extending the frequency tuning range and enhancing the modulation resolution of a digitally controlled oscillator (DCO), comprising:
    a single segmented unified tuning bank comprising:
        a coarse tuning bank comprising a plurality of coarse tuning devices adapted to provide coarse frequency tuning control of said DCO;
        a fine tuning bank comprising a plurality of fine tuning devices adapted to provide fine frequency tuning control of said DCO;
    harmonic calibration means in combination with a DCO gain estimation means operative to determine a mismatch error value between said coarse tuning devices and said fine tuning devices; and
    a pre-distortion circuit operative to compensate a DCO input signal for mismatches between said coarse tuning devices and said fine tuning devices utilizing said mismatch error value to yield a compensated DCO input signal thereby.

17. The apparatus according to claim 16, wherein said harmonic calibration circuit comprises:
    means for applying sinusoidal modulation to said DCO to yield a plurality of harmonics in an observable frequency modulated radio frequency (RF) spectrum; and
    means for estimating said mismatch error value in said unified tuning bank utilizing a level of a second harmonic of said plurality of harmonics.

18. The apparatus according to claim 17, further comprising means for tuning the magnitude of said applied sinusoidal modulation to average over a plurality of most significant bit (MSB) device combinations.

19. The apparatus according to claim 16, wherein said harmonic calibration means and said DCO gain estimation means operate in a built-in self-test (BIST) manner.

20. The apparatus according to claim 16, wherein said coarse tuning bank comprises a 128-bit thermometer coded most significant bit (MSB) tuning bank.

21. The apparatus according to claim 16, wherein said fine tuning devices comprise inversion-type Complementary Metal Oxide Semiconductor (CMOS) tuning varactors.

22. The apparatus according to claim 16, wherein said fine tuning bank comprises a 16-bit thermometer coded least significant bit (LSB) tuning bank.

23. The apparatus according to claim 16, wherein said unified tuning bank further comprises a sigma-delta least significant bit (SD-LSB) tuning bank having a plurality of 1X devices.

24. The apparatus according to claim 16, wherein said pre-distortion circuit comprises means for multiplying said DCO input by said mismatch error value and adding a product generated thereby to said DCO input to generate said compensated DCO input signal.

25. A transmitter comprising:
   a frequency synthesizer for performing a frequency modulation; said frequency synthesizer comprising a digitally controlled oscillator (DCO);
   said DCO comprising means for extending the frequency tuning range of said DCO, comprising:
      a single segmented unified tuning bank comprising:
         a coarse tuning bank comprising a plurality of coarse tuning devices adapted to provide coarse frequency tuning control of said DCO;
         a fine tuning bank comprising a plurality of fine tuning devices adapted to provide fine frequency tuning control of said DCO;
      harmonic calibration means in combination with DCO gain estimation means for determining an average ratio mismatch error value between said coarse tuning devices and said fine tuning devices; and
      a pre-distortion circuit operative to compensate a DCO input signal for mismatches between said coarse tuning devices and said fine tuning devices utilizing said mismatch error value to yield a compensated DCO input signal thereby.

26. A digital to analog quantity converter (DAC), comprising:
   a single segmented unified bank of conversion devices, comprising:
      a coarse bank comprising a plurality of coarse conversion devices adapted to provide coarse control of said analog quantity;
      a fine bank comprising a plurality of fine conversion devices adapted to provide fine control of said analog quantity; and
   a pre-distortion circuit operative to compensate a DAC input signal for mismatches between said coarse conversion devices and said fine conversion devices to yield a compensated DAC input signal thereby.

* * * * *